United States Patent [19]

Weyburne

[11] Patent Number: 4,736,705
[45] Date of Patent: Apr. 12, 1988

[54] APPARATUS FOR METAL ORGANIC CHEMICAL VAPOR DEPOSITION

[75] Inventor: David W. Weyburne, Maynard, Mass.

[73] Assignee: The United States of America as represented by the Secretary of the Air Force, Washington, D.C.

[21] Appl. No.: 885,117

[22] Filed: Jul. 14, 1986

[51] Int. Cl.$^4$ .............................................. C23C 16/00
[52] U.S. Cl. .................................... 118/725; 118/715; 118/728; 118/730
[58] Field of Search ................ 118/728, 725, 730, 715

[56] References Cited

U.S. PATENT DOCUMENTS

| | | | |
|---|---|---|---|
| 3,647,197 | 3/1972 | Holloway | 263/47 R |
| 3,785,853 | 1/1974 | Kirkman | 118/719 |
| 4,116,733 | 9/1978 | Olsen et al. | 148/175 |
| 4,314,873 | 2/1982 | Wieder et al. | 156/610 |
| 4,368,098 | 1/1983 | Manasevit | 156/606 |

Primary Examiner—Richard R. Bueker
Attorney, Agent, or Firm—Jules J. Morris; Donald J. Singer

[57] ABSTRACT

A metal organic chemical vapor deposition reactor 10 which includes a flat plate flow channel gas delivery system 18. The gas delivery system comprises slotted rods 40, 42 which pass through an assembly 46 of seal plates 52 and gas directing plates 50. Gas directing plates 52 provide separate flow channels for reactant gases in rods 40 and 42. Reactants are directly jetted from the gas directing plates onto a substrate 20 prior to mixing.

13 Claims, 2 Drawing Sheets

APPARATUS FOR METAL ORGANIC CHEMICAL VAPOR DEPOSITION

STATEMENT OF GOVERNMENT INTEREST

The invention described herein may be manufactured and used by or for the Government for governmental purposes without the payment of any royalty thereon.

TECHNICAL FIELD

This invention relates to semiconductors manufacture and an apparatus for growing epitaxial layers on substrates. The invention is particularly related to a chemical vapor delivery apparatus that promotes layer uniformity and abrupt heterojunction formation.

BACKGROUND OF THE INVENTION

Metal organic chemical vapor deposition (MOCVD) is one of the standard methods of manufacturing thin (epitaxial) layered crystals. These layered structures are required in many semiconductor components including transistors and heterojunction lasers. Conventional MOCVD systems utilize gaseous reactants with at least one of the reactants being a metal organic compound. During vapor deposition the reactants are introduced into a quartz tube reactor vessel in which a substrate is held by a substrate holder and susceptor. The susceptor is used to heat the substrate so that the reactants pyrolyze and deposit out onto the heated substrate. Typically, the reactants flow past the heated substrate at one end of the reaction vessel and are exhausted at a distant end. Heating is required for the vapor deposition and crystal growth; since the walls of the reactor are relatively cool the reactants should only pyrolyze at the heated substrate.

Many high quality semiconductor components such as high electron mobility transistors and multi-quantum well laser diodes require extremely sharp heterojunctions between dissimilar layers of semiconductor crystal. When heterojunctions are not sufficiently abrupt, grading and other defects occur which decrease component performance, reliability and life. Creating abrupt heterojunctions is a difficult requirement to consistently fulfill because many sophisticated heterojunction structures require abruptly switching of material in ten to twenty angstroms thick layers.

In conventional MOCVD reactors, gases pass through a long entrance area to establish a stabilized flow and then pass over the heated substrate. The reaction gases substantially fill the reactor vessel before they are exhausted. A problem that arises with MOCVD reactors stems from the formation of gas eddies in the reactor. As a result of the gas eddies, small amounts of reaction gases can continue to flow over the substrate after gas injection has been terminated or the reactant gases have been changed. The tendency of residual amounts of reaction gases to be held in the reaction vessel affects the formation of heterojunctions. Residue gases result in the formation of a graded layer between dissimilar epitaxial layers. This grading results in a poor or inoperative semiconductor structure.

Inert gases have been used to disperse residue gases that can cause grading. After a first epitaxial layer is deposited on a substrate an inert gas is flowed through the reactor vessel prior to the deposition of a second epitaxial layer. Use of inert gases has not, however, been completely successful, since thermal degradation of prior deposited layers can occur while the inert gas is flushing the reactor vessel. The thermal degradation of exposed surfaces of epitaxial layers also results in degraded crystal structure.

Another frequent problem common to conventional MOCVD reactors results from the premature mixing of reaction gases. Prereaction of gases can lead to severe compositional and thickness non-uniformities in the growth of epitaxial layers. Indium phosphide and indium gallium arsenide systems are particularly affected by premature mixing of reaction gases.

Yet another problem that has arisen with conventional MOCVD reactors is a tendency towards non-uniform crystal growth due to variations in the reactant flow as it travels across the substrate. Conventional MOCVD reactor flow channels attempt to obtain a well behaved, non-turbulent reactant flow by having a long entrance length and/or quartz inserts to shape the flow traveling across the substrate. Unfortunately, reactant gases can become deleted as they pass over the substrate and deposit unevenly.

Finally, conventional MOCVD reactors utilize only a relatively small portion of the reactants by deposition on the substrate. Most of the reactants fill the reaction chamber and flow out through the exhaust without ever passing in close proximity to the substrate. This increases cost and aggrevates the problems related to disposing highly toxic gases.

In view of the above a need clearly exists for refining the MOCVD reactor system in order to produce higher quality, more uniform semiconductors.

It is also an object of the invention to provide an MOCVD reactor with an improved gas delivery system that prevents premature mixing of reactants.

It is a further object of this invention to provide an MOCVD reactor that offers substantially reduced grading at heterojunctions.

It is yet another object of this invention to provide a MOCVD reactor which substantially increases the proportion of th reactants that flow directly past the substrate and are deposited thereon.

It is yet another object of this invention to provide a MOCVD reactor with an inexpensive gas control system that satisfies the above objects.

SUMMARY OF THE INVENTION

The invention comprises a MOCVD reactor having a reactor vessel with a gas inlet for injecting metal organic vapor and a gas outlet for exhausting the gas from the reactor vessel after it has passed by a substrate. The substrate is held on a substrate holder and susceptor which heats the substrate to promote metal organic vapor deposition. The MOCVD reactor also comprises a novel vapor delivery system that consists of a series of stacked flat plates positioned about a slotted rod which is connected to the gas inlet. The stacked plates surround rod slot and form a series of flat flow channels to deliver gas from the slotted rod to the vicinity of the substrate.

In the preferred embodiment of the invention the gas inlet supplies at least two separate gas streams which are held separately in at least two slotted rods passing through the stacked plates. A series of flat flow channels in the stacked plates provide separate flow paths for the gas streams until they reach the immediate vicinity of the substrate. The retention of the gases in channels and the separation of the streams discourages premature mixing of the gases and prevents the formation of eddy streams which might otherwise interfere with the formation of uniform epitaxial layers and abrupt heterojunctions.

A further aspect of the preferred embodiment of the invention comprises the use of two types of stacked plates. The stacked plates are preferably made from flat, high purity quartz sheets which are formed into seal plates and flow directing plates. The seal plates bracket the slotted portion of the rods to prevent uncontrolled gas flow whereas the flow directing plates have flat flow channels for directing gas onto the substrate. Typically each flow directing plate forms a gas flow path with only one of the slotted rods. The flat seal and gas directing plates are stacked to construct a gas directing module that seals the slotted rods except in the preferred gas delivery direction.

Further aspects of a preferred embodiment of the invention comprise a substrate holder that is rotatable during vapor deposition in order to enhance uniform vapor deposition upon the substrate.

BRIEF DESCRIPTION OF THE DRAWINGS

The foregoing and other objects and advantages of the invention will be apparent from the following more particular description of the prefarred embodiment of the invention, as illustrated in the accompanying drawings, in which like reference dharacters refer to the same parts throughout the different views. The drawings are not necessarily to scale, emphasis instead being placed upon illustrating the principles of the invention.

DETAILED DESCRIPTION OF THE INVENTION

Figure 1:
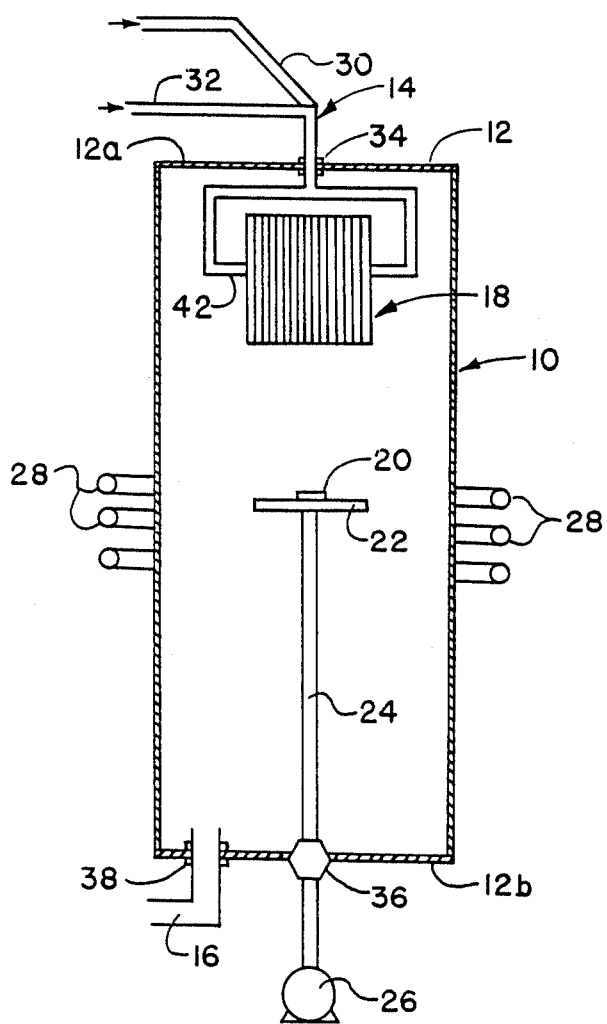
FIG. 1 is a schematic representation of an MOCVD reactor embodying the principles of this invention.
Figure 2:
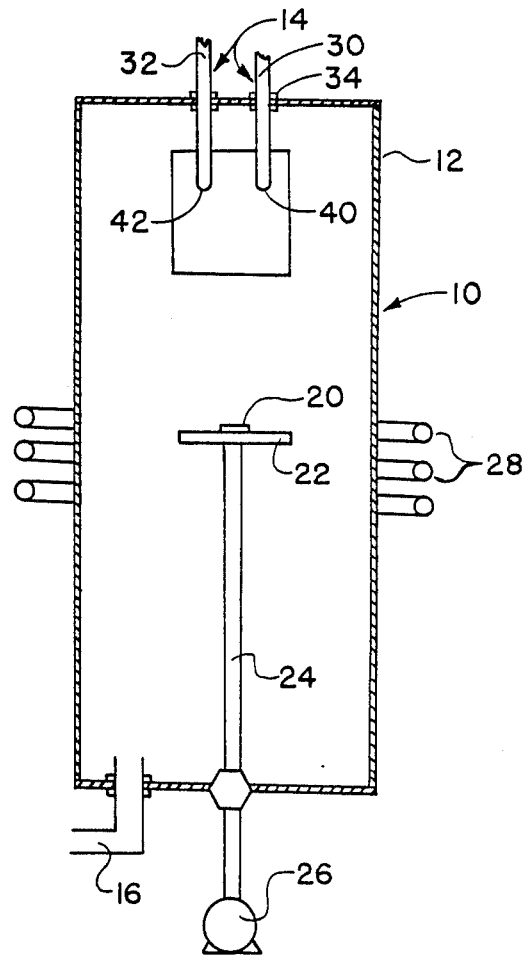
FIG. 2 is a schematic view of the MOCVD reactor of FIG. 1 wherein the reactor has been rotated 90°.

FIGS. 1 and 2 are schematic representations of a vertical MOCVD reactor 10 embodying the principles of this invention. FIG. 2 can be considered a side view of the reactor shown in FIG. 1.

The reactor 10 comprises a reactor vessel 12 having a gas inlet 14 and a gas exit 16. A gas delivery system 18 directs gas onto a substrate 20 positioned on a substrate holder 22. The substrate holder is connected by a rod 24 to a motor 26 that is used to rotate the substrate during vapor deposition. The substrate holder 22 is also a susceptor that is heated by radio frequency (RF) radiation from RF coils 28.

Operation of the MOCVD reactor is generally conventional; gas is introduced into the reactor by gas inlet 14 and delivered into the vicinity of the substrate by an unconventional gas delivery system 18. The substrate 20 is heated by the substrate holder 22 to a temperature suitable for pyrolyziug the reactants and promoting vapor deposition onto the substrate. Waste gas is removed through exhaust 16.

The reactor vessel is typically cylindrical and has flat ends 12a and 12b. The reactor vessel 12 can be constructed either conventionally out of quartz or from stainless steel. Stainless steel increases the safety and decreases the cost and manufacturing difficulties inherent in conventional MOCVD systems. It is only possible to switch to stainless steel construction when using the gas delivery system of this invention. This is because, as will be explained below, it is unlikely that spent reactants or other contaminants from the reaction chamber will flow past the substrate and contaminate it. This relaxes the construction material requirements for the rest of the reaction chamber.

Gas inlet 14 (gas streams 30, 32) passes through seals 34 at reactor vessel end 12a and is connected to the gas delivery system 18 near the substrate 20. The substrate is rotatably supported by the substrate holder 22 and support shaft 24. The support shaft 24 passes through a seal and bearing 36 at reactor end 12b. The exhaust tube 16 also passes through reactor end 12b and is sealed with seal 38. In some instances the entry and exit tubes can be welded or otherwise affixed to the reactor ends in a manner that eliminates the need for separate seals 34 and 38.

The substrate holder 22 is preferably a susceptor of graphite or other material which can be heated by a radio frequency source (RF). An RF source 2S surrounds the reactor chamber at a location parallel to substrate holder and susceptor 22. During vapor deposition the RF source is activated to heat the susceptor and thus the substrate 20. Typically the substrate is heated to 600° to 700° C. while the reactor wall temperature remains at about 200° to 300° C. This high temperature is required to pyrolyze the reactants and promcte uniform epitaxial growth. Little or no pyrolyzation should occur at the relatively cool reactor walls.

The substrate holder 22 is maintained in position by support shaft 24. Support shaft 24 proceeds through bearing 36 in reactor wall 12b to a conventional electric motor and stand 26. This electric xotor is used during vapor deposition to rotate the substrate underneath the gas delivery system 18 in order to promote uniform epitaxial growth.

In the views of FIGS. 1 and 2 the substrate 20 is centered upon the substrate holder, however, in some instances it may be desirable to place a number of substrates upon the substrate holder and have the substrate holder offset relative to the gas delivery system 18. A series of substrates could then be rotated beneath the gas delivery system for sequential vapor deposition.

Figure 3:
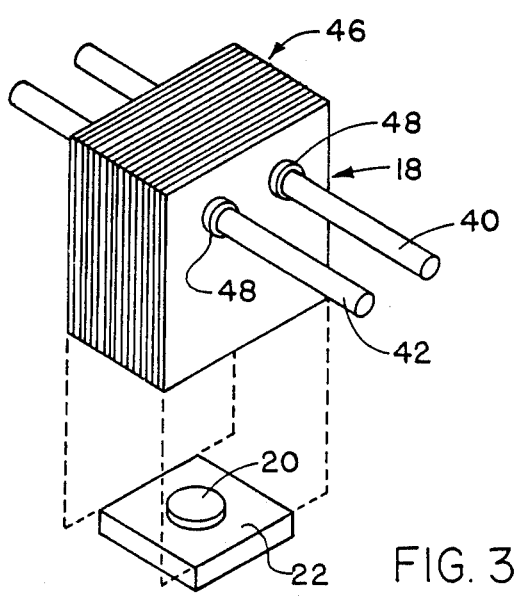
FIG. 3 is an isometric projection of the gas delivery system of the reactor of FIG. 1.
Figure 4:
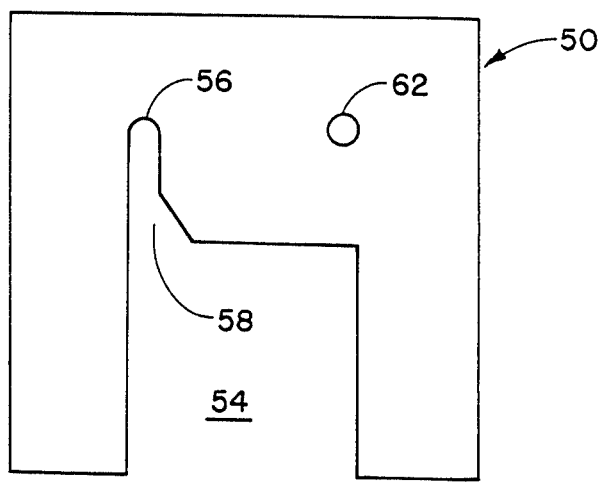
FIG. 4 is a plan viaw of a gas directing plate of the gas delivery system of FIG. 3.
Figure 5:
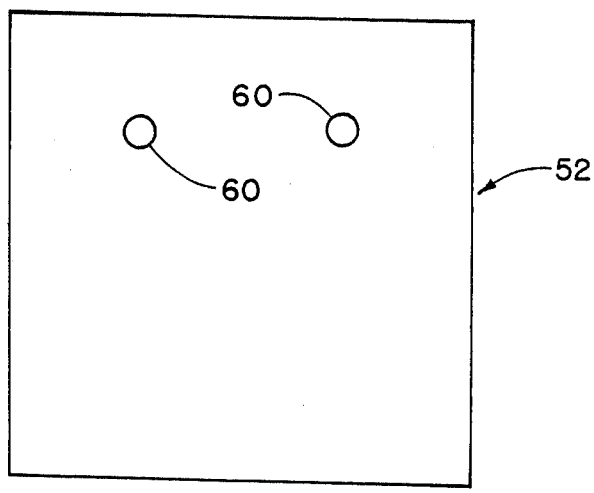
FIG. 5 is a plan view of a seal plate of the gas directing system of FIG. 3.

The MOCVD reactor of this invention utilizes a novel flat plate gas delivery system 18. The gas delivery system 18 is shown in perspective in FIG. 3. The components of the gas delivery system are shown individually in the views of FIGS. 4–6. The gas delivery system is connected to inlet gas streams 30 and 32 of gas inlet 14. Each of the inlet gas streams 30, 32 is split and joined to a hollow gas delivery rod 40, 42. The rods 40, 42 are therefore fed fresh inlet gas at both ends and the gas streams are kept separated. Feeding the rods at both ends, insures uni form delivery of fresh gas to the substrate.

Figure 6:
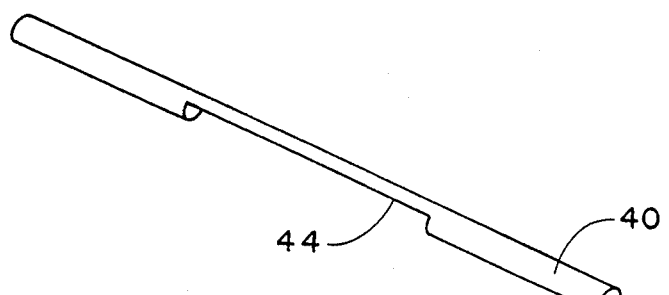
FIG. 6 is a perspective view of a slotted rod used in the gas delivery system of FIG. 3.

Slotted rod 40 is shown in perspective in FIG. 6, rod 42 is identical to rod 40. The reactants enter the gas delivery system 18 through hollow core rods 40, 42 that pass through the holes in a plate stack assembly 46. The hollow rods have slots 44 cut along a predetermined length of the rod. The length of the slot 44 is such that when the rod is placed through the stack assembly 46, the slotted part of the rod is completely encapsulated by the plate stack assembly 46.

The plate stack 46 is made up of gas directing plates 50 and seal plates 52. The insulating plates have holes 60 through which the slotted rods 40, 42 pass. The gas directing plate has a hole 62 through which one of the slotted rods passes and an opening 56 for a second slotted rod. A U-shaped gas delivery area 54 (FIG. 4) is fluidly connected to the slot of a rod (40 or 42) which passes through opening 56. A short channel 58 delivers the gas from the rod at opening 56 to the U-shaped plate portion 54 which is positioned above substrate 20. Gas directing plates 50 are sandwiched between flat seal plates 52 in order to form flat flow channels.

The outside diameter of the rod is only slightly smaller than the through holes 60, 62. As a result, very little reactant gas escapes from the rods except where it is directed by gas directing sections 58 and 54 of the U-shaped plate 50. Further, little gas reactant escapes through the ends of the stacked assembly, seal plates 52 and tight fitting O-rings 48 act to seal the ends of the rods.

The U-shaped plates can be stacked in one of two ways: the short channel 5S can be either on the left side or, by flipping the plate over on the right side of the plate. By flipping the plate, gas is directed from either one or the other of the two slotted rods 40, 42. When every other U-shaped plate 50 is flipped over a flat plate flow channel system is created that allows for two different reactants to be brought into the direct vicinity of the substrate. This arrangement keeps the two reactants separated until they exit from the bottom of the stack 46 onto the substrate. This prevents inadvertent and premature mixing of the two gas streams that pass through the plates.

The gas delivery system, which can be referred to as a flat plate flow channel (FPFC) system, delivers to the substrate the reactant gases used in the MOCVD process. It forms a replacement for the conventional quartz gas delivery tubes used in most MOCVD reactors. The seal plates and gas directing plates 50 and 52 are preferably made from thin flat plates of quartz to safeguard reactant purity. The whole plate stack assembly 46 is positioned so that gas flows directly from the stack onto the heated substrate 22. The width of the U-shaped hannels is the same as the width of the substrate. Enough plates are stacked together so that their stack height is the same as the length of the substrate. This insures good vapor coverage of the substrate. The plates 50, 52 can be positioned so that multiple gaseous reactants will flow through every other or every third, fourth, etc. channel.

The FPFC gas delivery system can be made quite small and compact. This permits the positioning of several FPFC delivery systems in the same reaction chamber. By moving the substrate from underneath one gas delivery device to another, extremely sharp junctions can be formed between layers of different composition. It is therefore possible to produce, in one growth chamber, high quality heterojunction devices using a simple and inexpensive gas control system. Examples of semiconductors which can be made by this process include high electron mobility transistors and multi-quantum well structures. This reactor is capable of depositing 10 to 20 angstrom thick layers and switching depositants very quickly without producing significant grading between the layers.

As mentioned above multiple substrates may be positioned on a rotary substrate holder 22. This solves the problem of simultaneously growing heterojunction structures on multiple substrates in one MOCVD reactor. The FPFC gas delivery system also solves the problem of the preaction of gas that sometimes occurs when reactant gas are initially brought together. The reactant gases are not allowed to mix until departing the delivery system directly above the substrate.

The gas composition that reaches the substrate surface is more uniform than that found in a conventional MOCVD system since the reactants are fed into both sides of the stack 18 and are ejected right above the substrate. This leads to good compositional and thickness uniformity. Rotating either the substrate or the FPFC gas delivery system also promotes layer uniformity.

The FPFC gas delivery system provides a forced free jet type of flow that brings the reactants into direct contact with the substrate first and minimizes the chances of reactant contamination due to contact with the reactor vessel 12 or with waste gases. This relaxes the construction material requirements for reaction chambers. Therefore, as mentioned above, the reaction chamber can be made out of stainless steel which increases the safety and decreases the cost and manufacturing difficulties encountered with MOCVD systems.

In the conventional design a significant portion of the reactant gases fail to flow close enough to the substrate to participate in the growth process. Since the FPFC gas delivery system delivers all of the reactants directly to the substrate, under-utilization and waste of reactants has been reduced.

The reduction of waste gas stemming from use of this gas delivery system has important implications. Arsine and phosphine are very toxic gases and require expensive waste treatment; use of less arsine and phosphine reduces waste treatement costs. In typical MOCVD reactors the elemental group V to group III ratio (i.e., arsine to organo gallium) can be as high as 100 to 1. This reactor should operate successfully with a much lower group V to group III ratio, further reducing costs and lowering the amount of toxic waste gas.

Another aspect of the FPFC gas delivery system is that it is capable of promoting reactant specific photo assisted epitaxial growth. In conventional photo assisted growth all of the reactants are usually irradiated in a non-specific manner. Since the FPFC gas delivery system allows for separate flow channels for each reactant it is possible to radiate only certain reactants and not others.

While the invention has been shown in reference to the preferred embodiments thereof, it will be understood by those skilled in the art that various changes in substance and form can be made therein without having departed from the spirit and the scope of the invention as defined in the appended claims. For example, the FPFC gas delivery system can be designed with multiple FPFC gas delivery stacks. By moving the substrate from underneath one stack to a second or third stack extremely sharp heterojunctions between layers of different compositions can be easily formed in one growth chamber. Alternately various substrate transport mechanisms can be adapted to this reactor in order to bring substrates sequentially in fluid contact with FPFC gas delivery stacks.

I claim:

1. A metal organic vapor deposition reactor comprising:
   (a) a reactor vessel;
   (b) a gas inlet for injecting gas into said reactor vessel;

(c) a gas outlet for exhausting gas from said reactor vessel;

(d) substrate holder inside said reactor for holding a substrate upon which metal organic vapor desposition is to be encouraged; and (e) a vapor delivery system comprising;
 (i) a slotted hollow rod attached to said gas inlet,
 (ii) a series of stacked plates positioned about said hollow rod and surrounding said slot, and
 (iii) a flow channel in at least one of said stacked plates, said flow channel for allowing gas to pass from said hollow rod and directly into the vicinity of said substrate.

2. The metal organic vapor deposition reactor of claim 1 wherein said gas inlet comprises at least two separate gas inlet streams which are held separate in at least two slotted hollow rods passing through said stacked plates.

3. The metal organic vapor deposition reactor of claim 1 wherein said stacked plates comprise flat, high purity quartz sheets.

4. The metal organic vapor deposition reactor of claim 1 wherein said stacked plates further comprise insulator plates and flow directing plates, said insulating plates bracketing said slot to prevent uncontrolled gas flow and said flow directing plates for directing gas flow onto said substrate.

5. The metal organic vapor deposition reactor of claim 2 wherein said stacked plates further comprise insulator plates and flow directing plates, said insulating plates for preventing premature mixing of said gas inlet streams as well as for bracketing said slots of said hollow rods to prevent uncontrolled gas flow and said flow directing plates oriented for separately directing gas flow from said gas inlet streams onto said substrate.

6. The metal organic vapor deposition reactor of claim 2 wherein said substrate holder is rotatable to enhance uniform vapor deposition on said substrate.

7. The metal organic vapor deposition reactor of claim 2 wherein said substrate holder further comprises a susceptor for heating said substrate.

8. The metal organic vapor deposition reactor of claim 1 wherein said hollow rod extends through said stacked plates and is connected at both ends to said gas inlet in order to provide uniform delivery of said gas to said substrate.

9. A vapor deposition reactor comprising:
(a) a reactor vessel;
(b) a gas inlet for injecting at least two gas streams into said reactor vessel;
(c) a gas outlet for exhausting gas from said reactor vessel;
(d) a substrate holder inside said reactor vessel for holding a substrate upon which vapor is to be deposited; and
(e) a gas delivery apparatus comprising:
 (i) at least two slotted hollow rods attached to said gas inlet, each of said hollow rods fluidly connected to one of said gas streams,
 (ii) a flat plate gas directing module comprising a succession of flat plates, at least some of said plates having flow channels for the transfer of gas directly from said slotted hollow rods to the immediate vicinity of said substrate.

10. The vapor deposition reactor of claim 9 wherein said flat plates further comprise insulator plates and flow directing plates, said insulating plates for preventing premature mixing of said gas inlet streams as well as for bracketing said slots of said hollow rods to prevent uncontrolled gas flow and said flow directing plates oriented for separately directing gas flow from said gas inlet streams onto said substrate.

11. The vapor deposition reactor of claim 9 wherein said substrate holder is rotatable to enhance uniform vapor deposition on said substrate.

12. The vapor deposition reactor of claim 9 wherein said substrate holder further comprises a susceptor for heating said substrate.

13. The vapor deposition reactor of claim 9 wherein said flat plate comprises high purity quartz sheets.

* * * * *